United States Patent [19]

Ogushi

[11] Patent Number: 4,956,337
[45] Date of Patent: Sep. 11, 1990

[54] NB-SI-AL-O SUPERCONDUCTORS WITH HIGH TRANSITION TEMPERATURES AND PROCESS FOR MANUFACTURING THE SAME

[75] Inventor: Tetsuya Ogushi, Kagoshima, Japan

[73] Assignee: Kagoshima University, Kagoshima, Japan

[21] Appl. No.: 367,060

[22] Filed: Jun. 16, 1989

Related U.S. Application Data

[63] Continuation-in-part of Ser. No. 262,181, Oct. 20, 1988, abandoned, which is a continuation of Ser. No. 943,518, Dec. 17, 1986, abandoned.

[30] Foreign Application Priority Data

Jan. 22, 1986 [JP] Japan ................................. 61-11728

[51] Int. Cl.$^5$ ..................... H01C 39/12; C23C 14/34; B05D 5/12
[52] U.S. Cl. ......................................... 505/1; 29/599; 204/192.24; 252/512; 252/518; 423/600; 427/62; 427/63; 501/73; 501/134; 505/730; 505/731; 505/775; 505/801; 505/806; 505/816
[58] Field of Search ..................... 29/599; 204/192.24; 252/512, 518; 420/425, 580, 901; 423/593, 600, 618; 427/62, 63, 250, 255.3; 501/42, 73, 134, 153; 505/1, 730, 731, 775, 801, 806, 816

[56] References Cited

FOREIGN PATENT DOCUMENTS 62-170108  7/1987  Japan ................................. 505/806
62-171924  7/1987  Japan ................................. 505/1

OTHER PUBLICATIONS

Wang et al., "High Rate Sputter-Deposited Nb$_3$X Containing Oxygen", AIME 1976, Fall Meeting, 9/1986.
Gavaler et al., "The Effect of Oxygen on the Low Temperature Growth of the High-Tc A15 Superconductors", Conference on Superconductivity in d- and f-Band Metals, Karlsnehe, F. R. Germany, Jun. 1982.
Ihara et al., "Oxidation Mechanism of the Surface of A15 Superconductors", International Cryogenic Materials Conf., 5th Plenum Press 1984.
Ogushi, Appl. Phys. Lett. 48 (17), Apr. 1986, pp. 1167-1168.

Primary Examiner—Prince E. Willis
Assistant Examiner—Linda D. Skaling
Attorney, Agent, or Firm—Flynn, Thiel, Boutell & Tanis

[57] ABSTRACT

A superconductive material with a superconducting critical temperature of at least 77° K. comprising 20 at. % Nb, 10 at. % Si, 10 at. % Al and 60 at. % O is provided by simultaneous vapor-phase physical deposition or sputtering of Nb, Si and Al onto a heated sapphire substrate under oxygen-containing atmosphere, followed by a rapid quenching or post-oxidization of Nb-Si-Al ternary system composition having an Nb/Si/Al atomic ratio of 2/1/1. The high critical temperature allows abundantly existing, cheap available liquid nitrogen to be used as a cryogen for developing superconductivity.

11 Claims, 2 Drawing Sheets

NB-SI-AL-O SUPERCONDUCTORS WITH HIGH TRANSITION TEMPERATURES AND PROCESS FOR MANUFACTURING THE SAME

CROSS-REFERENCE TO RELATED APPLICATION

This application is a continuation-in-part of copending U.S. patent application, Ser. No. 07/262,181, filed Oct. 20, 1988, now abandoned which in turn is a continuation of Ser. No. 06/943,518, filed Dec. 17, 1986, now abandoned.

BACKGROUND OF THE INVENTION

1. Field of the Invention

The present invention relates to superconductors having a high transition temperature and manufacturing processes thereof.

2. Related Art Statement

Heretofore, the study of materials with a high critical temperature (Tc) of the transition from a normal conducting state to a superconducting state has been a very active research areas. In 1973, J. R. Gavalar sputtered Nb-Ge films in high argon pressure onto hot substrates and obtained superconducting transition with an onset temperature (Tco) of 22.3° K. (Appl. Phys. Lett. 23, 480, 1973). Soon after that, L. R. Testardi achieved an onset temperature (Tc) of 23.2° K. with the same material (Solid State Commun. 15, 1, 1974). Many researchers extensively have examined Nb$_3$Ge and, however, the Tco for this compound has not exceeded 23.9° K. until now.

D. Hughes, et al predicted from the empirical relationship for the critical temperature of some A 15 superconductors, that if Nb$_3$Si crystallized in the A 15 structure, it should have Tc$\approx$38° K. (Nature, 250, 723, 1974). However the crystal in a good ordered state with a small lattice constant is very difficult to make. S. Geller also suggested a stoichiometric $\beta$-W type Nb$_3$Si should have a superconducting transition temperature of between 31° K. and 35° K. (Appl. Phys., 7, 321, 1975). Many experimental approaches have been tried. Although a new phase prepared was identified as A 15 and lattice spacings being as low as $\sim$5.09 Å that was almost the predicted value, the Tc for Nb$_3$Si still remained to be 18.6° K.

Thus, many efforts to raise the critical temperature (Tc) have so far been made, nevertheless, it has increased at a rate of only about 1° K. per year, and the presently known highest superconducting critical temperatures do not exceed 23.6° K.

Accordingly, in order to utilize those conventional superconductive materials as a superconductor, it is necessary to cool them with a cryogen having a freezing temperature not higher than 23.6° K.

Freezing temperatures of known cryogens are enumerated below.

Liquid helium; 4.2° K.
Liquid hydrogen; 20.4° K.
Liquid air; 70°-80° K.
Liquid nitrogen; 77° K.

Among the above, liquid helium, which is a scantly natural resource has so far been used as a cryogen for developing superconductivity, because the critical temperatures of conventional superconductive materials are relatively low.

Accordingly, superconductive materials with a high critical temperature (Tc) has so far been eagerly desired to be developed.

SUMMARY OF THE INVENTION

The inventor and his collaborators have reported a resistance anomaly of very thin Nb-Si film (Jpn. J. Appl. Phys., 19, 2003, 1980). The anomaly is marked by a sudden drop in the resistance by a factor of $\sim 10^3$ at a temperature of $\sim 180°$ K. The behavior bears many resemblances to those of a superconductor. However the accuracy of measurements has been hampered by poor reproducibility of the anomaly. Recently it has become clear that an existence of oxygen during sputtering remarkably improves the reproducibility of the resistance anomaly.

As a result of further assiduous researches, the inventor has found out that superconductive materials having a critical temperature (Tc) not lower than 77° K., exceeding by far the ever known highest critical temperatures, e.g. 23.6° K., are obtainable by introducing oxygen into a superconductive material, which allow less expensive cryogens such as liquid nitrogen or the like to be employed, and has thus accomplished the present invention.

An object of the present invention is to provide superconductors having a high critical temperature which enable liquefied gases other than liquid helium to be used as a cryogen, for example, liquid nitrogen.

A further object of the present invention is to make a technical breakthrough and develop extensive applications of superconducting engineering in diversified industrial fields.

Other objects and advantages of the present invention will become apparent from the detailed description to follow taken in conjunction with the appended claims.

The foregoing objects are attained by a superconductive material according to the present invention, having a superconducting critical temperature of at least 77° K., which is composed of 20 atomic % niobium (Nb), 10 atomic % silicon (Si), 10 atomic % Aluminum (Al) and 60 atomic % oxygen (O), in the forms of an alloy or intermetallic compound and oxides, of Nb, Si and Al.

More particularly, the superconductive material according to the present invention, having the above described composition, comprises crystal grains of Nb-Si-Al intermetallic compound having an Nb/Si atomic ratio of 2/1 and a grain boundary phase comprising oxides of Nb, Si and Al.

It is really surprising that the critical temperature has been raised at a stride from 23.6° K. to 77° K. or higher according to the present invention and hitherto any superconductive materials with such a high critical temperature has never been known.

The superconductive materials of the present invention can be manufactured by a process comprising: maintaining a sapphire substrate at a temperature of 500 to 800° C. under an atmosphere containing oxygen of $0.1 \times 10^{-5} \sim 1$ torr.; depositing Nb, Si and Al simultaneously onto said substrate by means of vapor-phase physical deposition or sputtering, in such an amount to form a film composed of 20 atomic % Nb, 10 atomic % Si, 10 atomic % Al and 60 atomic % O, comprising Nb-Si-Al intermetallic compound crystalline grains having an Nb/Si atomic ratio of 2/1 and a grain boundary phase comprising oxides of Nb, Si and Al; and then quenching the formed film.

In another embodiment of the process according to the invention, the vapor-phase deposition or sputtering of Nb, Si and Al is carried out in an oxygen-free inert gas atmosphere to form an Nb-Si-Al ternary system film and after quenching, the formed film is post-oxidized in an atmosphere containing oxygen in an amount of at least the oxygen content of air to obtain a film having a composition of 20 atomic % Nb, 10 atomic % Si, 10 atomic % Al and 60 atomic % O, forming Nb-Si-Al intermetallic compound crystalline grains having an Nb/Si atomic ratio of 2/1 and a grain boundary phase comprising oxides of Nb, Si and Al.

In the superconductive material comprising Nb, Si and Al according to the present invention, it is conjectured that Nb and Si partially form an intermetallic compound crystalline grains having an Nb/Si atomic ratio of 2/1 and oxides of Nb, Si and Al are mixed in the grain boundary. Such a structure is considered to possess a strong possibility of presenting an exciton-mediating superconductivity which has never existed so far, different from the hitherto existing phonon-mediating superconductivity.

The principal feature of the process of the present invention is the incorporation of oxygen (O) into a film comprised of Nb, Si and Al, during and/or after the film formation. The incorporation of oxygen can be effected by any one or combination of the following methods.

(1) A specified amount of oxygen is added during deposition.
(2) After deposition in an oxygen-free atmosphere, the formed film is oxidized artificially in oxygen atmosphere.
(3) The oxygen-free film is naturally oxidized in air for a long period of time.

Since films obtained by the first two methods are apt to show lack of stability, the characteristics of which will change with elapsed time, it is preferred to effect the second or third method until the films have been oxidized substantially into a passive state in which the films cannot be further oxidized.

BRIEF DESCRIPTION OF THE DRAWING

With reference to the accompanying drawing.

DETAILED DESCRIPTION OF THE INVENTION

The process of the present invention to produce a superconductive material having a critical temperature of at least 77° K. will be explained in detail by way of examples based on the sputtering method.

Typically, the superconductive material i.e. film, of the invention is manufactured, in particular, by a process as follows.

A polished single crystalline sapphire substrate is mounted on an Nb sample holder in a sputtering chamber and heated to 500°~800° C. by an Nb heater. Nb, Si and Al with a selected atomic ratio are simultaneously sputtered onto the heated substrate in Ar atmosphere, feeding gaseous oxygen of $0.1 \times 10^{-5} \sim 1$ torr. into the sputtering chamber, under sputtering conditions of an Ar pressure of $1 \times 10^{-2}$ torr. to 0.7 torr., a plate voltage of 200~600 V and a plate current of 200~600 mA. Then, the deposited film is quenched rapidly right after the deposition with a cooling rate of about 100° C./min. 4,000° C./min., preferably about 1,100° C./min. to 2,000° C./min., down to the temperature of liquid nitrogen.

Thus, a superconductive material with a transition temperature of at least 77° K. composed of 20 atomic % Nb, 10 atomic % Si, 10 atomic % Al and 60 atomic % O is obtained which consists of crystalline grains of Nb-Si-Al intermetallic compound having an Nb/Si atomic ratio of 2/1 and a grain boundary phase comprising oxides of Nb, Si and Al.

Further, as already described hereinbefore, the incorporation of oxygen may be effected by subjecting an Nb-Si-Al ternary system film having an atomic ratio of Nb:Si:Al of 2:1:1 which has been formed on the polished single crystalline sapphire substrate by simultaneous sputtering of Nb, Si and Al each in a selected amount in an inert gas atmosphere such as Ar alone, followed by a rapid quenching, to a post oxidation treatment. The post-oxidation treatment includes a forcible oxidation by means of electric discharge at about 50 V in an oxygen atmosphere of about 0.5 torr., and natural oxidation in air for a long period of time, for example, 1~4 years. If the oxygen content reaches 10–60 atomic %, the film will become a passive state which suppresses further oxidation. Such a case is understood to fall in the scope of the present invention as long as the formed material has a composition satisfying the requirements defined in appended claims.

Figure 1:
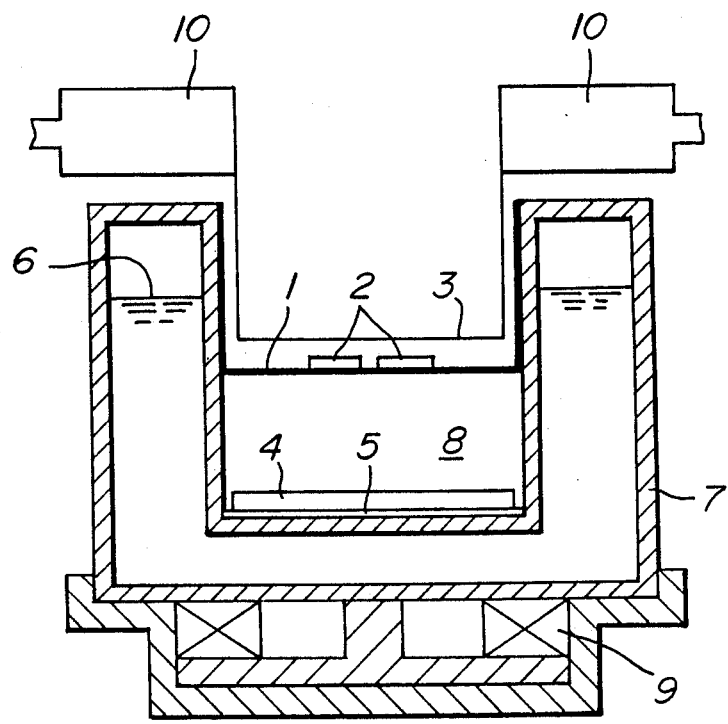
FIG. 1 is a schematic view of an example of an apparatus for vapor-phase deposition of superconductive films of the present invention.

In FIG. 1 illustrating an example of an apparatus to be employed to carry out the process of the present invention, a sputtering chamber 8 wherein D.C. magnetron sputtering is carried out has its bottom and periphery defined by the innerwall of a cryogen container 7 encapsulating a cryogen 6 e.g. liquid $N_2$. The innerwall of the container 7 plays two important roles: (a) it acts as a cryopump to purify the environment, since the shape of the susceptor 1 is designed to getter impurity gases effectively by putting a lid on the sputtering chamber 8, and (b) the bottom surface cools down a target 4 which helps to increase the sputtering rate and suppress the out-gas from it. In addition, the sputtering of materials with a low melting temperature is possible.

The target 4 is insulated from the container 7 by an insulator 5 e.g. a thin alumina plate. A heater 3 is connected with a heater holder 10 and is cooled by flowing water.

A cylindrical lanthanum magnet 9 supplies a magnetic field parallel to the target 4 to increase the sputtering rate which results in that of even 3,000 Å/min. for Nb.

This apparatus is furnished with a system to quench films just after deposition. The quenching plays an important role to suppress stable phases in competition to grow up. As is shown in FIG. 1, the susceptor 1 is tightly fixed on the liquid $N_2$ container 7 by screws to make good thermal contact. Therefore, the temperatures of the susceptor 1 and sapphire substrates 2 on it start to decrease from the moment the current flowing through the heater 3 is cut. The quenching rate depends on the level of the cryogen 6, e.g., liquid $N_2$ in the container 7, so that the rate is controlled by it. In addition, the initial rate of temperature decrease is determined by the starting temperature. If the quenching commences at a temperature of, for example, about 1,200° C., a decreasing rate of about 4,000° C./min. will be obtained. Even though the quenching rate is not very high, this system is apparently effective in forming metastable compounds and clear differences between unquenched and quenched are observed.

The target 4 consists of a transistor grade Si chip having a size of 25 mm×25 mm placed on an Nb disc having a purity of 3 nines (99.9%) and having a diameter of 100 mm which may be also cooled by the thermal conduction from the container 7 through the copper plate.

At the same time, this container 7, e.g., with 10.6 cm inside dia., 16.0 cm outside dia. and 4.5 cm height acts as a cryopump. Therefore, Bell jar is completely separated from the pumping system with a main valve closed fully or at high Ar pressure, pumping may be done together with it by using a by-path. This mechanism is very useful to purify the environment.

The susceptor 1 is, for example, 1 mm thick and ~20 mm wide. The heater 3 for the substrates 2 is made of Nb and the heater holder 10 is cooled by water-circulation to depress generation of out-gas as a large current (~170A) is flowing during deposition. The evaporation rate of liquid $N_2$ in the container during sputtering will be ~0.5 liter/min. which depends on the substrate temperature and Ar gas pressure.

In another embodiment, the deposited film immediately after deposition onto substrate can be quenched at a rate of ~1,100° C./min. to ~2,000° C./min. by the thermal conduction through the Nb susceptor 1 connected with the container 7 full of liquid $N_2$.

Using the above-mentioned apparatus, the process of the present invention is typically carried out as follows.

From the target 4 placed on the bottom surface of the sputtering chamber 8 shown in FIG. 1, Nb, Si and Al are simultaneously sputtered and deposited onto the sapphire substrate 2, by controlling the sputtering so as to yield an Nb/Si/Al atomic rate of 2/1/1. At the same time oxygen is fed into the chamber 8 as adjusting its feeding pressure with a needle valve, so that the deposited film may contain 60 atomic % of oxygen.

When the oxygen content is less than the above defined atomic percentage, the formation of oxides will become difficult, and on the other hand, if excessive, the film will exhibit nonconductive or strong semiconductive properties. Additionally, if the deposited Nb and Si contents are deviated far from the abovespecified values, intermetallic compounds with an Nb/Si atomic ratio of 2/1 will be hardly formed, so that in neither case superconductivity is obtainable.

Critical temperatures not higher than 20° K. of Nb-Si binary alloys known as superconductive materials have presumably been raised by incorporation of Al and oxides of those substances. Although its theoretical interpretation has not yet elucidated sufficiently, it is conjectured as follows.

Namely, adding Al to the components for conventional superconductive materials i.e. Nb and Si, vapor-phase deposition or sputtering of an Nb-Si-Al ternary system film is carried out in a cryogen container to deposit Nb, Si and Al simultaneously onto a substrate and then the formed film is quenched by cold from the cryogen container maintained at temperatures below 77° K. In this case, when the vapor-phase deposition is effected under an atmosphere containing oxygen of $0.5 \times 10^{-5} \sim 1$ torr in the sputtering chamber, Nb, Si and Al form intermetallic compound crystalline grains and respective oxides of Nb, Si and Al, i.e., $Nb_2O_5$, $NbO_2$, $SiO_2$ and $Al_2O_3$ are formed in the grain boundary. These oxides are insulators or semiconductors whose holes and electrons in the film are supposed to form a kind of exciton whereby a superconductor having a transition temperature (Tc) of 77° K. or higher is obtained.

The above principle is proposed here first by the inventor. If the transition temperature is 77° K. or higher, employment of liquid nitrogen, etc. is enabled so that superconducting apparatus and machinery operatable by non-expensive cryogens can be manufactured. Thus, since liquid helium (4.2° K.) can be replaced by liquid nitrogen as a cryogen for developing superconductivity, superconducting engineering will make innovative long strides, so that nuclear fusion, MHD generators, superconducting generators, quantum meters, superconducting computers, superconducting magnets, etc. can be provided with cheaper prices by a factor of 10 to 100 than the current prices.

The present invention will be explained in more detail by way of example.

Example

An Nb-Si-Al film was formed by vapor-phase deposition on a polished single crystalline sapphire substrate having a size of 15 mm×10 mm×1.0 mm. Direct-current high-speed sputtering of Nb, Si and Al was effected onto the sapphire substrate heated at 700° C. with a voltage of 450 V and an electric current of 200 mA in argon gas of 0.5 torr. and oxygen gas of $10^{-5}$ torr. as adjusting the oxygen feeding amount with a needle valve, so that the deposited film might possess a composition of 20 atomic % Nb, 10 atomic % Si, 10 atomic Al and 60 atomic % O.

Figure 2:
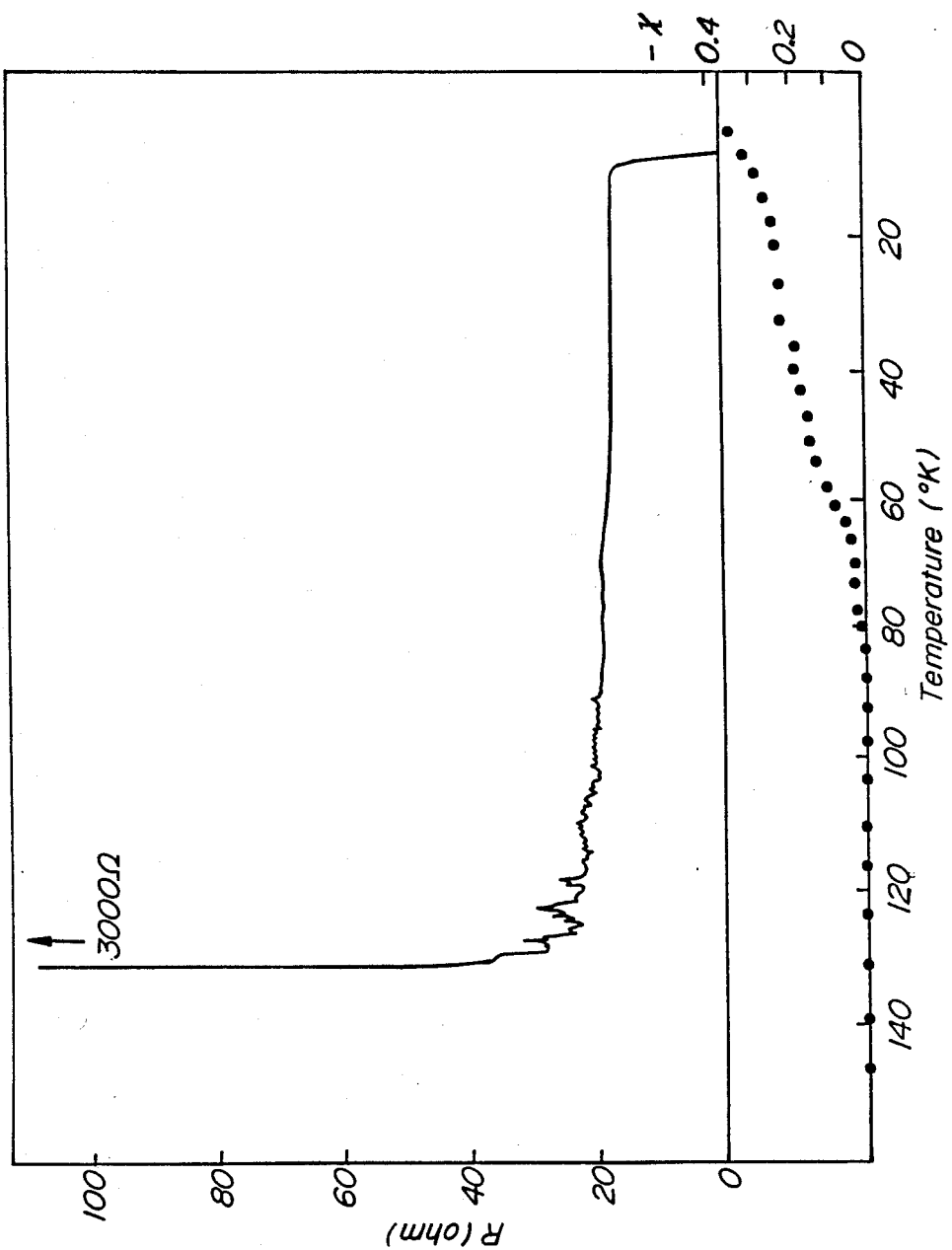
FIG. 2 shows an X-Y recorder trace of a resistive transition curve and Meissner effect vs. temperature for a superconductive film according to the present invention.

The resultant superconductive material with a high critical temperature exhibits a sudden resistance drop at 130° K. and the Meissner effect at 77° K. onwards as shown in FIG. 2 wherein the solid line shows resistance and the dotted line shows Meissner effect. The above fact demonstrates that a novel material has been provided, presumably by the aforementioned excitons formed by an interaction between electrons and holes, breaking down the old common sense that the highest critical temperature achievable is only 23.6° K. for the conventional superconductivity attributable to lattice vibration.

As has been explained above, the superconductors according to the present invention comprising Nb-Si-Al ternary crystalline grains and a grain boundary phase comprising oxides, have a superconducting critical temperature of 77° K. or higher, which enable the utilization of liquid nitrogen as a cryogen which is an abundant natural resource, very convenient to handle and cheaply available, in all superconducting technical fields.

While there have been shown and described the preferred embodiments of the present invention, it will be obvious to those skilled in the ar that various alternations and modifications thereof can be made without departing from the scope of the invention as defined by the following claims.

What is claimed is:

1. A superconductive material with a superconducting critical temperature of at least 77° K., having a composition of 20 atomic % niobium (Nb), 10 atomic % silicon (Si), 10 atomic % aluminum (Al) and 60 atomic % oxygen (O), which comprises crystalline grains of intermetallic compound comprising Nb, Si, and Al and having an Nb/Si atomic ratio of 2/1, said superconductive material containing oxides of Nb, Si and Al in the boundaries of said crystalline grains.

2. A process for manufacturing a superconductive material having a superconducting critical temperature of at least 77° K., which comprises: maintaining a sapphire substrate at a temperature of 500 to 800° C. under an inert gas atmosphere at a pressure of from $1 \times 10^{-2}$ to 0.7 Torr; depositing Nb, Si and Al simultaneously onto said substrate by means of vapor-phase physical deposition or sputtering with a plate voltage of from 200 to 600 V, and introducing oxygen at a pressure of from $0.1 \times 10^{-5}$ to 1 Torr in such an amount to form a film composed of 20 atomic % Nb, 10 atomic % Si, 10 atomic % Al and 60 atomic % O, and forming (1) crystalline grains of intermetallic compound comprising Nb, Si and Al and having an Nb/Si atomic ratio of 2/1 and (2) oxides of Nb, Si and Al in the boundaries of the crystalline grains; and then quenching the formed film.

3. A process as claimed in claim 2, which further comprises post-oxidizing the quenched film in an atmosphere containing oxygen in an amount of at least the oxygen content of air.

4. A process as claimed in claim 3, wherein the post-oxidizing is effected until the film is oxidized substantially into a passive state in which the film cannot be further oxidized.

5. A process as claimed in claim 2, wherein the quenching is carried out at a cooling rate of about 100°–4,000° C./min. down to the temperature of liquid nitrogen.

6. A process as claimed in claim 5, wherein the cooling rate is about 1,100°–2,000° C./min.

7. A process for manufacturing the superconductive material having a superconducting critical temperature of at least 77° K., which comprises: maintaining a sapphire substrate at a temperature of 500 to 800° C.; depositing Nb, Si and Al each in a selected amount simultaneously onto said substrate in an oxygen-free inert gas atmosphere having a pressure of from $1 \times 10^{-2}$ to 0.7 Torr by means of vapor-phase physical deposition or sputtering with a plate voltage of from 200 to 600 V, to form an Nb-Si-Al ternary system film; then quenching the formed film; and then post-oxidizing the quenched film in an atmosphere containing oxygen in an amount of at least the oxygen content of air to obtain a film having a composition of 20 atomic % Nb, 10 atomic % Si, 10 atomic % Al and 60 atomic % O, forming (1) crystalline grains of intermetallic compound comprising Nb, Si and Al having an Nb/Si atomic ratio of 2/1 and (2) oxides of Nb, Si and Al in the boundaries of said crystalline grains.

8. A process as claimed in claim 7, wherein the post-oxidizing is effected until the film is oxidized substantially into a passive state in which the film cannot be further oxidized.

9. The superconductive material prepared by the process of claim 2.

10. The superconductive material prepared by the process of claim 7.

11. The superconductive material as claimed in claim 1 which has the shape of a thin film which has been quenched to form metastable compounds, said film containing an amount of oxygen effective to passivate the film so that further oxidation of said film is suppressed.

* * * * *